(12) United States Patent
Yokoyama et al.

(10) Patent No.: US 11,108,090 B2
(45) Date of Patent: *Aug. 31, 2021

(54) POWER STORAGE DEVICE, TRANSPORT EQUIPMENT, AND CONTROL METHOD

(71) Applicant: HONDA MOTOR CO., LTD., Tokyo (JP)

(72) Inventors: Shinichi Yokoyama, Saitama (JP); Keiichiro Homma, Saitama (JP)

(73) Assignee: HONDA MOTOR CO., LTD., Tokyo (JP)

( * ) Notice: Subject to any disclaimer, the term of this patent is extended or adjusted under 35 U.S.C. 154(b) by 224 days.

This patent is subject to a terminal disclaimer.

(21) Appl. No.: 16/345,086

(22) PCT Filed: Oct. 31, 2017

(86) PCT No.: PCT/JP2017/039380
§ 371 (c)(1),
(2) Date: Apr. 25, 2019

(87) PCT Pub. No.: WO2018/084152
PCT Pub. Date: May 11, 2018

(65) Prior Publication Data
US 2019/0288347 A1    Sep. 19, 2019

(30) Foreign Application Priority Data

Nov. 1, 2016 (JP) .............................. JP2016-214661

(51) Int. Cl.
*G01R 31/392* (2019.01)
*G01R 31/382* (2019.01)
(Continued)

(52) U.S. Cl.
CPC ............... *H01M 10/42* (2013.01); *B60L 3/00* (2013.01); *B60L 50/60* (2019.02); *B60L 53/66* (2019.02);
(Continued)

(58) Field of Classification Search
CPC ............... H01M 10/42; H01M 10/443; H01M 2220/20; H01M 10/48; H01M 10/44;
(Continued)

(56) References Cited

U.S. PATENT DOCUMENTS

2012/0056588 A1* 3/2012 Cai .......................... B60L 53/11
320/128
2015/0137752 A1    5/2015 Shinzaki et al.
(Continued)

FOREIGN PATENT DOCUMENTS

JP    2003-284244 A    10/2003
JP    2011-130575 A    6/2011
(Continued)

OTHER PUBLICATIONS

E. Sortomme and M. A. El-Sharkawi, "Optimal Scheduling of Vehicle-to-Grid Energy and Ancillary Services," in IEEE Transactions on Smart Grid, vol. 3, No. 1, pp. 351-359, Mar. 2012, doi: 10.1109/TSG.2011.2164099. (Year: 2012).*
(Continued)

*Primary Examiner* — Stacy Whitmore
(74) *Attorney, Agent, or Firm* — Paratus Law Group, PLLC

(57) ABSTRACT

A power storage device includes a storage battery capable of transferring electric power to and from an external electric power network, a receiver configured to receive an instruction related to transfer of the electric power, and a controller configured to control charge and discharge of the storage battery according to the instruction. The instruction includes
(Continued)

a first instruction for requesting switching between short-term charge and discharge from the storage battery to the electric power network, and a second instruction for requesting continuous discharge from the storage battery to the electric power network. The instruction allowed by the controller varies depending on a variable representing a state of charge of the storage battery by a level of a value.

11 Claims, 5 Drawing Sheets

(51) Int. Cl.
    *B60L 53/66*     (2019.01)
    *H01M 10/44*     (2006.01)
    *H01M 10/42*     (2006.01)
    *B60L 55/00*     (2019.01)
    *H01M 10/48*     (2006.01)
    *B60L 3/00*     (2019.01)
    *H02J 3/32*     (2006.01)
    *H02J 7/00*     (2006.01)
    *B60L 50/60*     (2019.01)
    *B60L 58/13*     (2019.01)

(52) U.S. Cl.
    CPC .............. *B60L 55/00* (2019.02); *B60L 58/13* (2019.02); *G01R 31/382* (2019.01); *G01R 31/392* (2019.01); *H01M 10/44* (2013.01); *H01M 10/48* (2013.01); *H01M 10/486* (2013.01); *H02J 3/32* (2013.01); *H02J 7/00* (2013.01); *Y02T 10/70* (2013.01)

(58) Field of Classification Search
    CPC . H01M 10/486; G01R 31/392; G01R 31/382; Y02E 60/10; Y02T 90/12; Y02T 90/14; Y02T 10/7072; Y02T 90/16; Y02T 10/70; H02J 7/00712; H02J 7/007192; H02J 7/0048; H02J 3/322; H02J 3/241; H02J 3/32; H02J 7/00; B60L 58/24; B60L 50/60; B60L 58/13; B60L 3/00; B60L 55/00; B60L 53/66
    See application file for complete search history.

(56) References Cited

U.S. PATENT DOCUMENTS

| | | |
|---|---|---|
| 2017/0317507 A1 | 11/2017 | Kudo |
| 2021/0009004 A1* | 1/2021 | Tsutsumi ................ B60L 55/00 |
| 2021/0013555 A1* | 1/2021 | Pol ...................... H01M 4/5825 |
| 2021/0018331 A1* | 1/2021 | Tsuchiya ................ B60K 37/02 |
| 2021/0020932 A1* | 1/2021 | Badding ................ C01G 51/42 |
| 2021/0020998 A1* | 1/2021 | Musafia ............ H01M 10/4257 |

FOREIGN PATENT DOCUMENTS

| | | |
|---|---|---|
| JP | 2013-169069 A | 8/2013 |
| JP | 2015-109791 A | 6/2015 |
| WO | WO 2016/030967 A1 | 3/2016 |
| WO | WO 2016/063739 A1 | 4/2016 |

OTHER PUBLICATIONS

Cui, Tiansong et al., "Optimal control of PEVs for energy cost minimization and frequency regulation in the smart grid accounting for battery state-of-health degradation", DAC '15: Proceedings of the 52nd Annual Design Automation Conference•Jun. 2015 •Article No. 134 •pp. 1-6 (Year: 2015).*

Feb. 6, 2018, International Search Report issued for related PCT Application No. PCT/JP2017/039380.

Feb. 6, 2018, International Search Opinion issued for related PCT Application No. PCT/JP2017/039380.

* cited by examiner

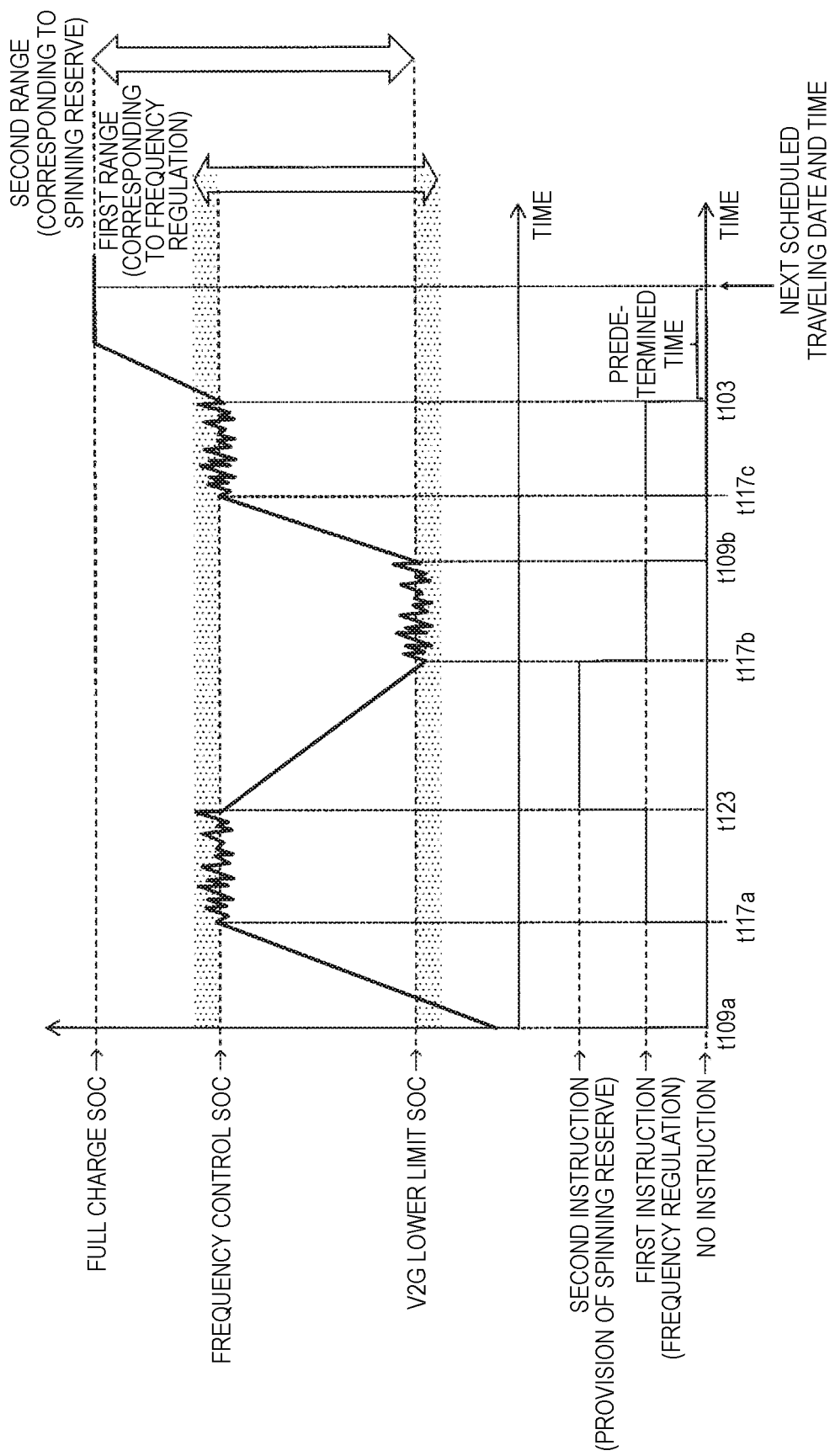

POWER STORAGE DEVICE, TRANSPORT EQUIPMENT, AND CONTROL METHOD

CROSS REFERENCE TO PRIOR APPLICATION

This application is a National Stage Patent Application of PCT International Patent Application No. PCT/JP2017/039380 (filed on Oct. 31, 2017) under 35 U.S.C. § 371, which claims priority to Japanese Patent Application No. 2016-214661 (filed on Nov. 1, 2016), which are all hereby incorporated by reference in their entirety.

TECHNICAL FIELD

The present invention relates to a power storage device, a transport equipment, and a control method in a smart grid capable of bidirectionally transferring electric power between a storage battery and an electric power system.

BACKGROUND ART

PTL 1 describes a charge and discharge control of an electric vehicle in a vehicle to grid (V2G). V2G is one of business models for realizing a smart grid, and is a system which performs interchange of electric power between an electric power system including a commercial electric power network and an electric vehicle. In V2G, when the electric vehicle is not used as moving means, a storage battery mounted on the electric vehicle is used as one of electric power storage facilities in the commercial electric power network. Therefore, the electric power is bidirectionally transferred between the electric vehicle participating in V2G and the electric power system. The electric vehicle participating in V2G performs a continuous discharge for the purpose of maintaining supply-demand equilibrium in the electric power system, and the charge and discharge for the purpose of stabilizing frequency in the electric power system. Electric power obtained by the continuous discharge of the electric vehicle for the purpose of maintaining the supply-demand equilibrium is used as "spinning reserve" of the electric power system. In addition, electric power transferred by the charge and discharge of the electric vehicle for the purpose of stabilizing the frequency is used for "frequency regulation" of the electric power system. In each case, the electric vehicle contributes to stabilization of the electric power system.

CITATION LIST

Patent Literature

[PTL 1]: US Patent Application Publication NO. 2015/0137752 specification

SUMMARY OF INVENTION

Technical Problem

In the charge and discharge control described in Patent Document 1, until a state of charge (SOC) of the storage battery mounted on the electric vehicle is lowered to a SOC set by a driver of the electric vehicle, the discharge for the purpose of the above-described spinning reserve is permitted, and thereafter, the charge and discharge for the purpose of the frequency regulation is permitted. In this manner, in a state where the SOC of the storage battery is high, priority is given to the discharge for the purpose of the spinning reserve, and the charge and discharge for the purpose of the frequency regulation is performed with the SOC of the storage battery lowered. Therefore, there is an effect that deterioration and overdischarge of the storage battery can be suppressed.

However, supply-demand balance of the electric power in the electric power system including the commercial electric power network changes every moment. In other words, surplus electric power may also be generated in the electric power system, in addition to a situation in which the electric power system requires the spinning reserve and a situation in which the electric power system requires the frequency regulation. In V2G, if charge and discharge of the storage battery is not performed in response to various situations in the electric power system, an incentive such as money as compensation for participating in V2G cannot be efficiently obtained.

The "spinning reserve" in V2G described above is obtained by the electric vehicle continuing to discharge a current amount which is not small. On the other hand, the "frequency regulation" in V2G is realized by the electric vehicle instantaneously and frequently switching between the charge and discharge. Such a difference in a charge and discharge mode may accelerate the deterioration of the storage battery in the electric vehicle on which one type of storage battery is mounted. When the storage battery deteriorates by participating in V2G, an owner of the electric vehicle tends to hesitate to participate in V2G. When not participating in V2G, the incentive such as money as the compensation are not obtained, and as a result, an electric power quality of an external electric power system is greatly affected, which may lead to disbenefit of the whole society from a general company to a general household using the electric power system.

An object of the present invention is to provide a power storage device, a transport equipment, and a control method which can efficiently obtain an incentive while suppressing deterioration of a storage battery and can contribute to an electric power quality of an electric power system.

Solution to Problem

In order to achieve the above object, according to a first aspect, there is provided a power storage device including:

a storage battery (for example, a storage battery 125 in an embodiment to be described later) capable of transferring electric power to and from an external electric power network (for example, an electric power network 12 in the embodiment to be described later);

a receiver (for example, a digital communication unit 123 in the embodiment to be described later) configured to receive an instruction related to transfer of the electric power to and from the electric power network; and a controller (for example, an ECU 131 in the embodiment to be described later) configured to control charge and discharge of the storage battery according to the instruction, wherein the instruction includes a first instruction for requesting switching between short-term charge and discharge from the storage battery to the electric power network, and a second instruction for requesting continuous discharge from the storage battery to the electric power network, and wherein the controller is configured to allow the storage battery to start charge and discharge that correspond to the first instruction when a variable representing a state of charge of the storage battery by a level of a value is a value between a first value (for example, a frequency control SOC in the embodiment to be described later) smaller than an upper limit value (for example, a full charge SOC in the embodiment to be described later) that the state of charge reaches when the storage battery is fully charged and a second value (for example, a V2G lower limit SOC in the embodiment to be described later) smaller than the first value, and allow the storage battery to start discharge that corresponds to the second instruction when the variable is a value between the upper limit value and the second value.

A second aspect according to the first aspect, wherein the storage battery is mounted on a transport equipment (for example, an electric vehicle 15 in the embodiment to be described later).

A third aspect according to the first or second aspect, wherein when the receiver receives the first instruction and the second instruction, the controller gives priority to the second instruction when the variable is a value between the first value and the second value.

A fourth aspect according to any one of the first to third aspects, wherein the controller is configured to store, for each state of charge of the storage battery, a deterioration influence degree of the storage battery when the storage battery performs the charge and discharge that correspond to the first instruction, and set the first value related to the variable to a value such that the deterioration influence degree is equal to or less than a threshold value when the storage battery performs the charge and discharge that correspond to the first instruction.

A fifth aspect according to any one of the first to fourth aspects, wherein the controller sets the first value based on a temperature of the storage battery.

A sixth aspect according to the fifth aspect, wherein the controller sets the first value to a smaller value as the temperature of the storage battery is lower.

A seventh aspect according to any one of the second to sixth aspects, wherein the controller sets the second value based on an electric power amount required for a next traveling of the transport equipment.

An eighth aspect according to any one of the second to seventh aspects, wherein in a case where a time difference from the current time to a next scheduled traveling date and time of the transport equipment is larger than or equal to predetermined time, the controller allows the storage battery to charge until the variable reaches the first value if the receiver does not receive the instruction.

According to a ninth aspect, there is provided a power storage device including:

a storage battery (for example, a storage battery 125 in an embodiment to be described later) capable of transferring electric power to and from an external electric power network (for example, an electric power network 12 in the embodiment to be described later);

a receiver (for example, a digital communication unit 123 in the embodiment to be described later) configured to receive an instruction related to transfer of the electric power to and from the electric power network; and a controller (for example, an ECU 131 in the embodiment to be described later) configured to control charge and discharge of the storage battery according to the instruction, wherein the instruction includes a first instruction for requesting switching between short-term charge and discharge from the storage battery to the electric power network, and a second instruction for requesting continuous discharge from the storage battery to the electric power network, wherein the controller is configured to allow the storage battery to charge and discharge that correspond to the first instruction when a variable representing a state of charge of the storage battery by a level of a value is within a first range, and to allow the storage battery to discharge that corresponds to the second instruction when the variable is within a second range, and wherein the first range is narrower than the second range, and an upper limit of the first range is lower than an upper limit of the second range.

According to a tenth aspect, there is provided a transport equipment including the power storage device according to any one of the first to ninth aspects.

According to an eleventh aspect, there is provided a control method for a power storage device including a storage battery (for example, a storage battery 125 in an embodiment to be described later) capable of transferring electric power to and from an external electric power network (for example, an electric power network 12 in the embodiment to be described later), a receiver (for example, a digital communication unit 123 in the embodiment to be described later) configured to receive an instruction related to transfer of the electric power to and from the electric power network, and a controller (for example, an ECU 131 in the embodiment to be described later) configured to control charge and discharge of the storage battery according to the instruction, the instruction including a first instruction for requesting switching between short-term charge and discharge from the storage battery to the electric power network, and a second instruction for requesting continuous discharge from the storage battery to the electric power network, the control method including:

allowing the storage battery to start charge and discharge that correspond to the first instruction, when a variable representing a state of charge of the storage battery by a level of a value is a value between a first value (for example, a frequency control SOC in the embodiment to be described later) smaller than an upper limit value (for example, a full charge SOC in the embodiment to be described later) when the storage battery is fully charged and a second value (for example, a V2G lower limit SOC in the embodiment to be described later) smaller than the first value; and allowing the storage battery to start discharge that corresponds to the second instruction, when the variable is a value between the upper limit value and the second value.

Advantageous Effects of Invention

According to the first aspect, the tenth aspect, and the eleventh aspect, the short-term charge and discharge of the storage battery corresponding to the first instruction is repeated with the variable within a range between the first value and the second value, and the continuous discharge of the storage battery corresponding to the second instruction is performed with the variable within a range between the upper limit value and the second value. In this manner, since the charge and discharge that correspond to the first instruction and the continuous discharge that corresponds to the second instruction which have different modes are respectively performed within a suitable range of the variable, it is possible to efficiently obtain an incentive while suppressing deterioration of the storage battery and to contribute to an electric power quality of an electric power system including the electric power network.

According to the second aspect, also for the storage battery mounted on the transport equipment, it is possible to efficiently obtain the incentive while suppressing the deterioration of the storage battery and to contribute to the electric power quality of the electric power system including the electric power network.

According to the third aspect, since the priority is given to the continuous discharge of the storage battery corresponding to the second instruction, it is possible to acquire a more efficient incentive.

According to the fourth aspect, the first value, which is the upper limit of the range in which the charge and discharge that correspond to the first instruction and having a large influence on the deterioration of the storage battery is performed is set to a value such that the deterioration influence degree is equal to or less than the threshold value. Therefore, even if the charge and discharge that correspond to the first instruction is performed, the deterioration of the storage battery can be suppressed.

A performance required when the storage battery is charged varies depending on the temperature of the storage battery. According to the fifth aspect, the first value, which is the upper limit of the range in which the charge and discharge that correspond to the first instruction is performed, is set based on the temperature of the storage battery. Therefore, the range of the variable in which the charge and discharge that correspond to the first instruction is performed can be set to a suitable range according to a temperature environment of the storage battery.

The lower the temperature of the storage battery, the lower is a maximum value in the range of the variable at which the performance required when the storage battery is charged can guaranteed. According to the sixth aspect, the first value, which is the upper limit of the range in which the charge and discharge that correspond to the first instruction is performed, is set to a smaller value as the temperature of the storage battery is lower. Therefore, the range of the variable in which the charge and discharge that correspond to the first instruction is performed can be set to the suitable range according to the temperature environment of the storage battery.

According to the seventh aspect, the second value, which is a lower limit value in the range of the variable in which the charge and discharge that correspond to the first instruction is performed and a lower limit value in the range of the variable in which the continuous discharge that corresponds to the second instruction is performed, is set based on the electric power amount required for the next traveling of the transport equipment. Therefore, if the variable of the storage battery lowers to the second value, the controller does not allow the charge and discharge that correspond to the first instruction or the continuous discharge that corresponds to the second instruction. Therefore, it is possible to contribute to the electric power quality of the electric power system while securing the electric power amount required for the next traveling of the transport equipment.

According to the eighth aspect, in a case where the storage battery is charged when there is spare time before the next traveling of the transport equipment, since the storage battery is charged until the variable reaches the first value which is the upper limit of the range in which the start of the charge and discharge that correspond to the first instruction and the start of the continuous discharge that corresponds to the second instruction are allowed, an opportunity to contribute to the electric power quality of the electric power system is increased, and the incentive can be efficiently obtained.

According to the ninth aspect and the tenth aspect, the short-term charge and discharge of the storage battery corresponding to the first instruction is repeated when the variable is within the first range, and the continuous discharge of the storage battery corresponding to the second instruction is performed when the variable is within the second range which is wider than the first range and whose the upper limit is higher than the first range. In this manner, since the charge and discharge that correspond to the first instruction and the discharge that corresponds to the second instruction which have different modes are respectively performed within the suitable range of the variable, it is possible to efficiently obtain the incentive while suppressing the deterioration of the storage battery and to contribute to the electric power quality of the electric power system including the electric power network.

BRIEF DESCRIPTION OF DRAWINGS

FIG. 5 is a view showing an example of a change in a SOC of a storage battery when the electric vehicle participating in V2G operates according to an instruction from an aggregator.

DESCRIPTION OF EMBODIMENTS

Hereinafter, embodiments of the present invention will be described with reference to the drawings.

A vehicle to grid (V2G) system is a system which performs interchange of electric power between an electric power system including a commercial electric power network and an electric vehicle, and when the electric vehicle is not used as moving means, a storage batten mounted on the electric vehicle is used as an electric power storage facility. Therefore, the electric power is bidirectionally transferred between the electric vehicle participating in V2G and the electric power system.

The electric vehicle participating in V2G performs a continuous discharge for the purpose of maintaining supply-demand equilibrium in the electric power system, and a charge and discharge for the purpose of stabilizing frequency in the electric power system according to a situation of the electric power system. Electric power obtained by the continuous discharge of the electric vehicle for the purpose of maintaining the supply-demand equilibrium is used as "spinning reserve" of the electric power system. The continuous discharge for the spinning reserve is performed particularly for the purpose of supplying the electric power to the electric power system required to maintain the supply-demand equilibrium as electric power demand in the electric power system increases. In addition, electric power transferred by the charge and discharge of the electric vehicle for the purpose of stabilizing the frequency is used for "frequency regulation" of the electric power system. In each case, the electric vehicle contributes to stabilization of the electric power system.

Figure 1:
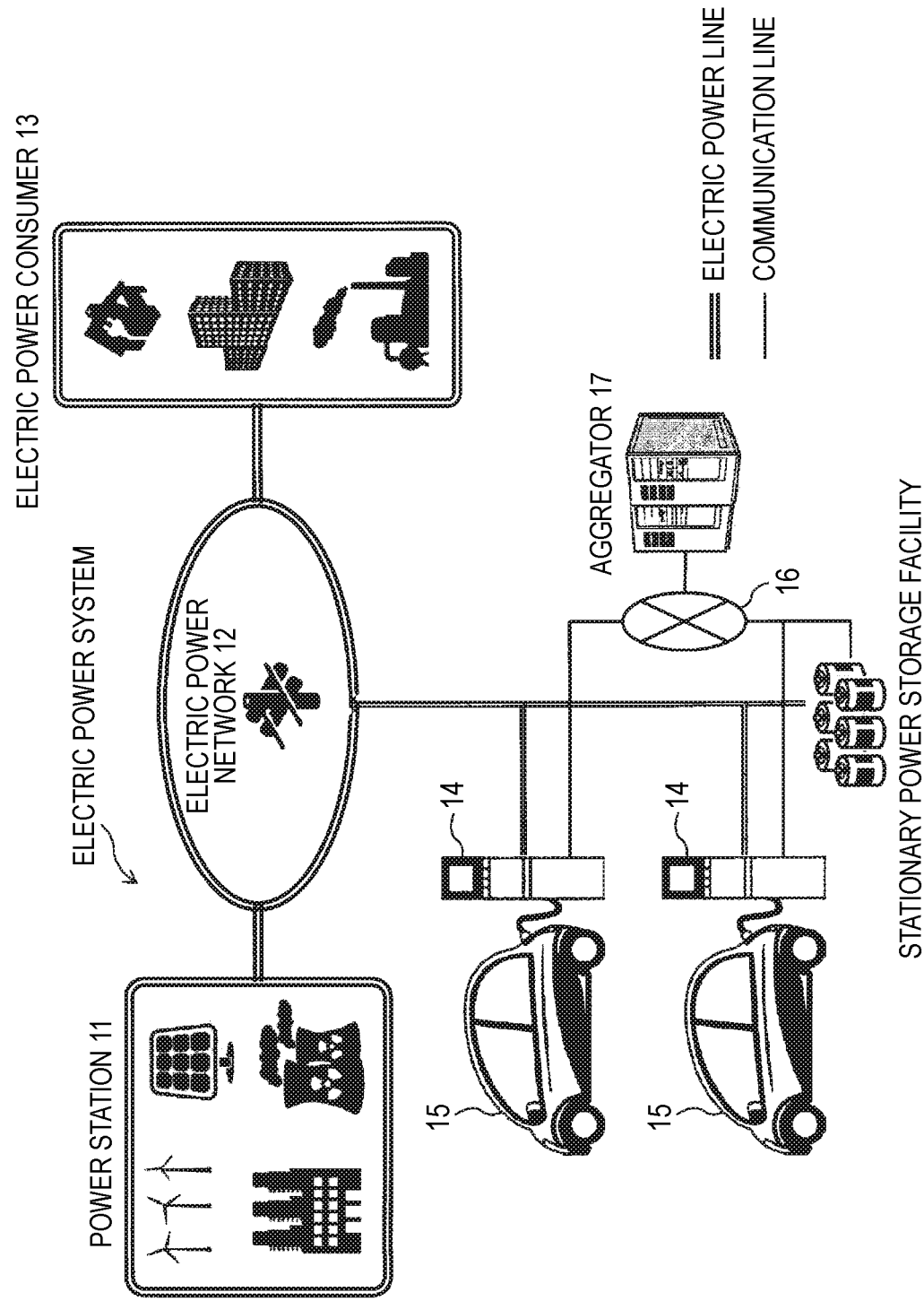
FIG. 1 is a view showing an overall configuration of a V2G system.

FIG. 1 is a view showing an overall configuration of the V2G system. As shown in FIG. 1, the V2G system includes an electric power system which is configured by an electric power supplier such as a power station 11 which generates power by energy such as thermal power, wind power, nuclear power or solar light, a power transmission network (hereinafter, referred to as an "electric power network") 12 of the electric power generated by the electric power supplier, or the like, an electric power consumer 13 which requires power and receives supply of the electric power, an electric vehicle service equipment (EVSE) 14 which is an external power supply device connected to the electric power network 12 via a power distribution facility (not shown), an electric vehicle 15 such as an electrical vehicle (EV) or a plug-in hybrid electric vehicle (PHEV) mounted with a chargeable/dischargeable storage battery, a communication network 16, and an aggregator 17 which manages the charge and discharge of the storage battery included in the electric vehicle 15 via the EVSE 14 connected to the communication network 16. By managing the charge and discharge of the storage battery of the electric vehicle 15 connected to the EVSE 14 by the aggregator 17, provision of the spinning reserve from the electric vehicle 15 to the electric power system or the frequency regulation of the electric power system can be performed, so that a requirement of an electric power company operating the power station 11, a power transmission company operating the electric power network 12 or the like can be meet.

Figure 2:
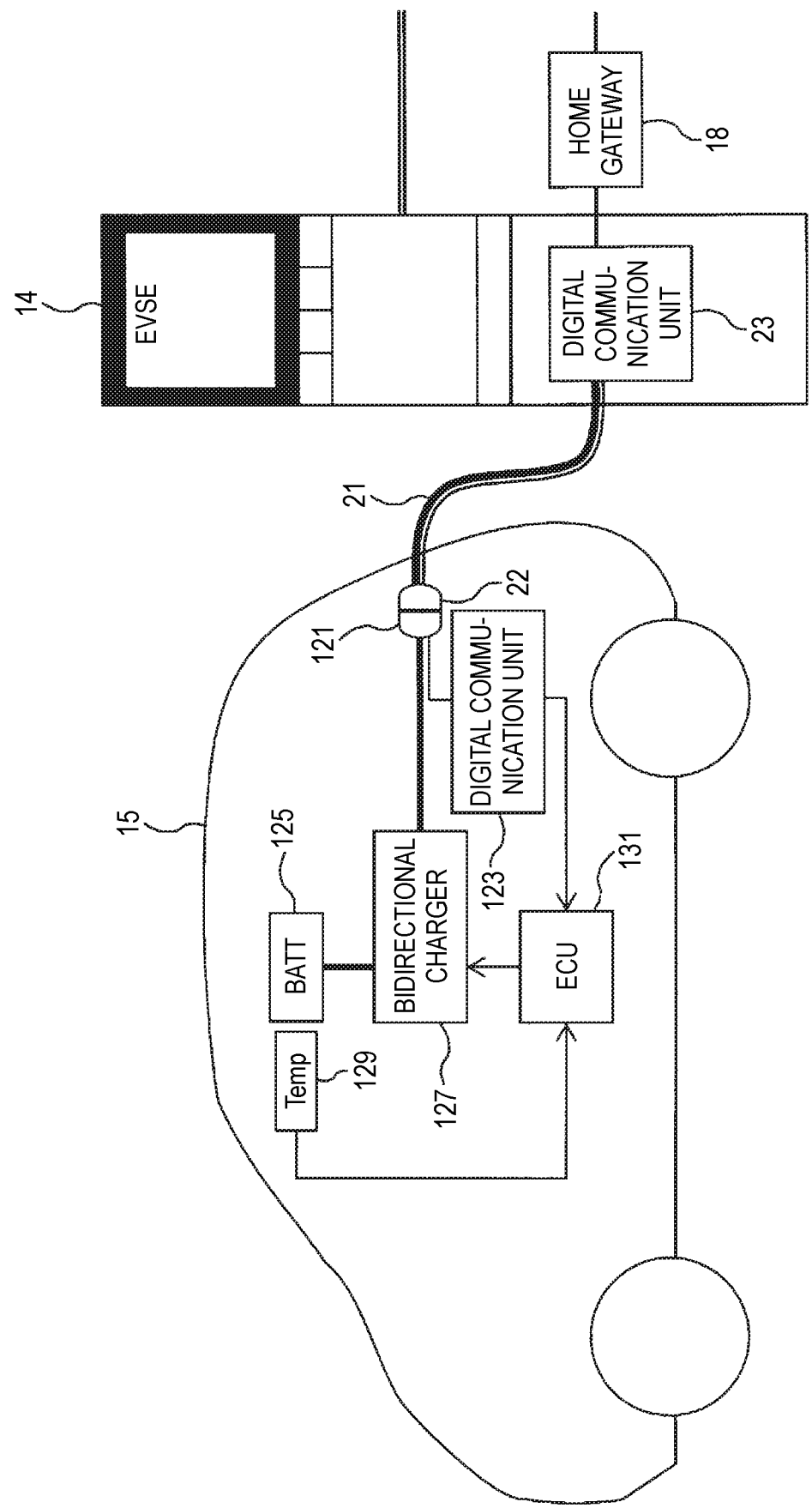
FIG. 2 is a block diagram showing an EVSE and an electric vehicle which configure a part of the V2G system shown in FIG. 1.

FIG. 2 is a block diagram showing the EVSE 14 and the electric vehicle 15 which configure a part of the V2G system shown in FIG. 1. As shown in FIG. 2, the EVSE 14 includes a connector 22 provided at a tip end of a cable 21 and a digital communication unit 23. In addition, the electric vehicle 15 includes an inlet 121, a digital communication unit 123, a chargeable/dischargeable storage battery 125, a bidirectional charger 127, a temperature sensor 129, and an electronic controller (ECU) 131.

Hereinafter, each constituent element of the EVSE 14 will be described.

The connector 22 transfers the electric power between the EVSE 14 and the electric vehicle 15 in a state of being connected to the inlet 121 of the electric vehicle 15. The digital communication unit 23 is connected to the communication network 16 via a home gateway 18, and superimposes a signal obtained from the aggregator 17 on electricity transferred between the EVSE 14 and the electric vehicle 15 using a power line communication (PLC) technology. Therefore, the signal from the aggregator 17 is sent to the electric vehicle 15 when the connector 22 is connected to the inlet 121 of the electric vehicle 15.

Next, each constituent element of the power storage device included in the electric vehicle 15 will be described.

The connector 22 of the EVSE 14 is attachable to and detachable from the inlet 121. In a state where the connector 22 of the EVSE 14 is attached to the inlet 121, the digital communication unit 123 receives a signal superimposed on the electricity from the EVSE 14 by the PLC technology. Further, a connection form between the electric vehicle 15 and the EVSE 14 is not limited to a physical connection by the inlet 121 and the connector 22, and may be an electromagnetic connection such as non-contact charge and discharge in a state where the inlet 121 and the connector 22 are close to each other.

The storage battery 125 includes a plurality of power storage cells such as a lithium ion battery and a nickel hydrogen battery. In a state where the electric vehicle 15 is not connected to the EVSE 14, the storage battery 125 supplies the electric power to an electric motor or the like (not shown) which is a drive source of the electric vehicle 15. In addition, in a state where the electric vehicle 15 is connected to the EVSE 14, the storage battery 125 transfers the electric power to and from the electric power network 12 according to the instruction sent from the aggregator 17 via the communication network 16 and the EVSE 14.

The bidirectional charger 127 converts an AC voltage obtained from the electric power network 12 via the EVSE 14 into a DC voltage. Electric power converted to the DC voltage by the bidirectional charger 127 is charged into the storage battery 125. In addition, the bidirectional charger 127 converts the DC voltage discharged from the storage battery 125 into the AC voltage. Electric power converted to the AC voltage by the bidirectional charger 127 is sent to the electric power network 12 via the inlet 121 and the EVSE 14.

The temperature sensor 129 detects a temperature of the storage battery 125. A signal indicating the temperature detected by the temperature sensor 129 is sent to the ECU 131.

Based on a voltage and an input/output current of the storage battery 125 detected by a voltage sensor and a current sensor (not shown), the ECU 131 derives a state of charge (SOC) which is a variable representing the state of charge of the storage battery 125 by a level (0% to 100%) of a value by a current integration method or an open circuit voltage (OCV) estimation method. In addition, the ECU 131 controls an operation of the bidirectional charger 127 according to the instruction indicated by the signal from the aggregator 17 received by the digital communication unit 123.

The instruction sent by the aggregator 17 to the electric vehicle 15 participating in the V2G is an instruction related to the transfer of the electric power between the electric vehicle 15 and the electric power network 12, and varies depending on an electric power quality or supply-demand balance of the electric power of the electric power network 12. In other words, the instruction is a first instruction for requesting the electric vehicle 15 to switch between charge and discharge in a short-term for frequency regulation of the electric power network 12 described above, or a second instruction for requesting the electric vehicle 15 to continue discharge for providing spinning reserve to the electric power network 12 described above.

Figure 3:
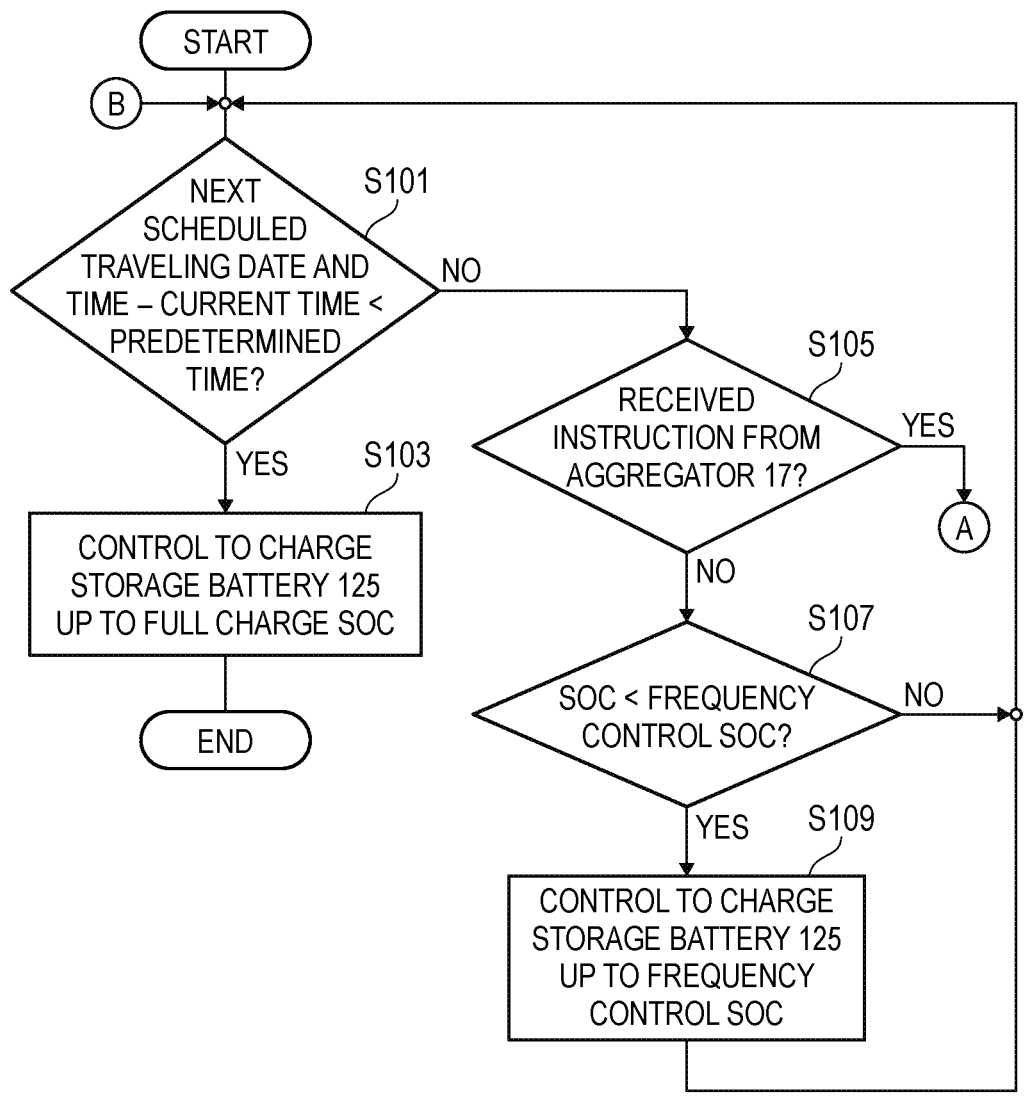
FIG. 3 is a flow chart showing an operation of an ECU when the electric vehicle connected to the EVSE participates in V2G.
Figure 4:
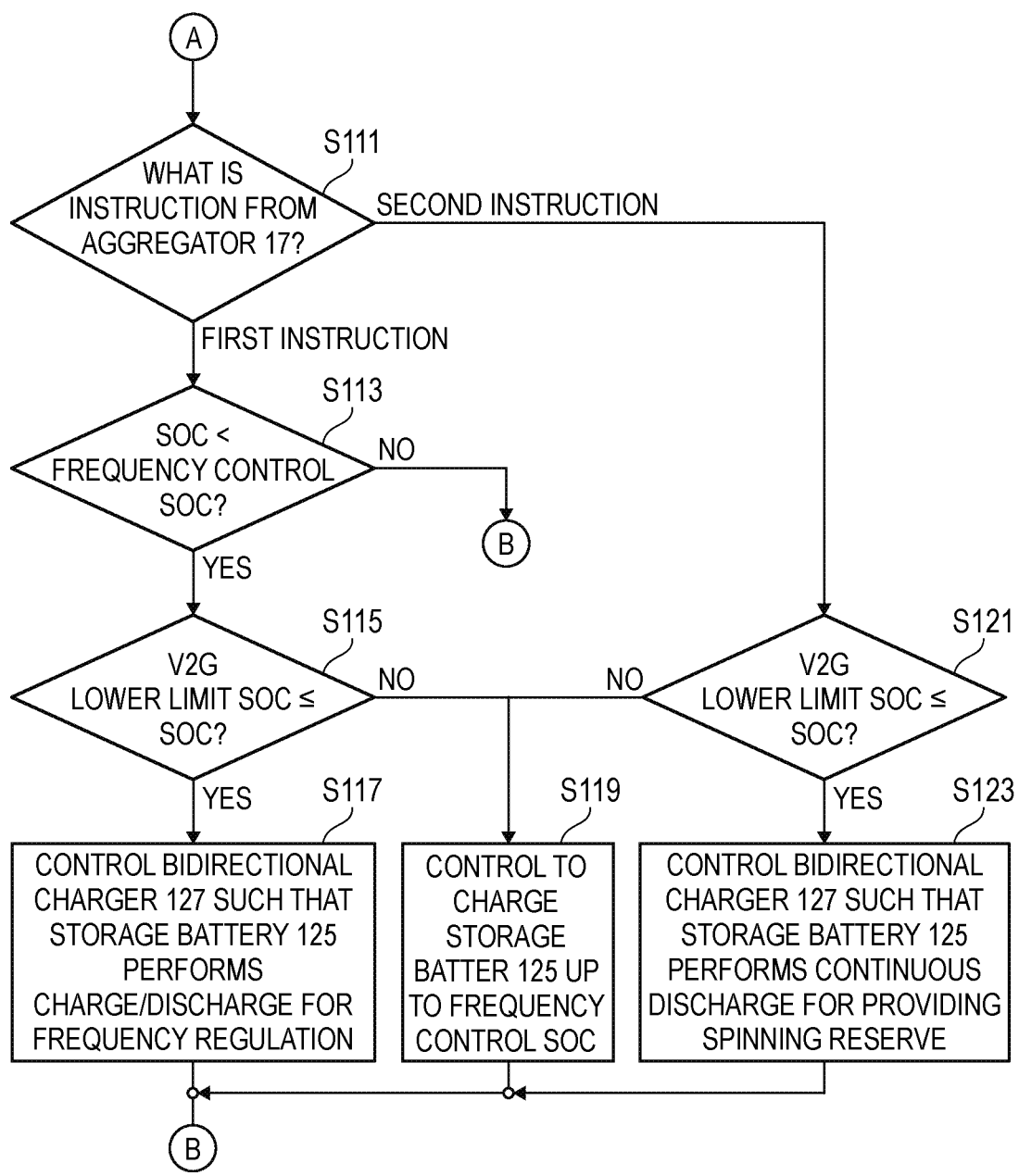
FIG. 4 is a flow chart showing an operation of the ECU when the electric vehicle connected to the EVSE participates in V2G.

Hereinafter, a control performed by the ECU 131 of the electric vehicle 15 which participates in the V2G and is connected to the EVSE 14 will be described in detail with reference to FIGS. 3 to 5. FIGS. 3 and 4 are flow charts showing operations of the ECU 131 when the electric vehicle 15 connected to the EVSE 14 participates in V2G. FIG. 5 is a view showing an example of a change in the SOC of the storage battery 125 when the electric vehicle 15 participating in V2G operates according to the instruction from the aggregator 17.

In the ECU 131, as a threshold value of the SOC of the storage battery 125 used when the electric vehicle 15 participates in V2G, a "frequency control SOC" having a value smaller than the SOC (a full charge SOC) when the storage battery 125 is fully charged and a "V2G lower limit SOC" having a value smaller than the frequency control SOC are preset. The frequency control SOC is a value set by a manufacturer of the electric vehicle 15. The V2G lower limit SOC is a value at which the storage battery 125 is capable of outputting an electric power amount consumed by traveling a preset distance by a driver during a next traveling of the electric vehicle 15. In other words, the V2G lower limit SOC is a value set by the driver of the electric vehicle 15.

A next scheduled traveling date and time of the electric vehicle 15 connected to the EVSE 14 is preset in the ECU 131. The next scheduled traveling date and time may be, for example, periodic date and time information such as 7:00 am on weekdays, or may be one-time date and time information such as 3:00 pm three days later.

As shown in FIG. 3, in the state where the electric vehicle 15 is connected to the EVSE 14, the ECU 131 in which the frequency control SOC, the V2G lower limit SOC, and the next scheduled traveling date and time are set determines whether a time difference from the current time to the next scheduled traveling date and time is less than predetermined time (step S101), if the above-described time difference (the next scheduled traveling date and time–the current time) is less than the predetermined time, the procedure proceeds to step S103, and if the above-described time difference is larger than or equal to the predetermined time, the procedure proceeds to step S105. In step S103, the ECU 131 controls the bidirectional charger 127 to charge the storage battery 125 with the electric power obtained from the electric power network 12 until the SOC of the storage battery 125 reaches the full charge SOC, as seen from increase in the SOC after time t103 shown in FIG. 5.

In step S105, the ECU 131 determines whether the digital communication unit 123 has received a signal including the instruction from the aggregator 17, if the instruction is not received, the procedure proceeds to step S107, and if the instruction is received, the procedure proceeds to step S111. In step S107, the ECU 131 determines whether the SOC of the storage battery 125 is less than the frequency control SOC, if the SOC<the frequency control SOC, the procedure proceeds to step S109, and if the SOC≥the frequency control SOC, a series of processing is ended. In step S109, the ECU 131 controls the bidirectional charger 127 to charge the storage battery 125 with the electric power obtained from the electric power network 12 until the SOC of the storage battery 125 reaches the frequency control SOC, as seen from increase in the SOC after time t109a, t109b shown in FIG. 5.

In step S111, the ECU 131 determines whether the instruction indicated by the signal received by the digital communication unit 123 is the first instruction or the second instruction, if the instruction is the first instruction, the procedure proceeds to step S113, and if the instruction is the second instruction, the procedure proceeds to step S121. In step S113, the ECU 131 determines whether the SOC of the storage battery 125 is equal to or lower than the frequency control SOC, if the SOC≤the frequency control SOC, the procedure proceeds to step S115, and if SOC>the frequency control SOC, a series of processing is ended. In step S115, the ECU 131 determines whether the SOC of the storage battery 125 is more than or equal to the V2G lower limit SOC, if the V2G lower limit SOC≤the SOC, the procedure proceeds to step S117, and if the lower limit SOC>the SOC, the procedure proceeds to step S119.

In step S117, since the SOC of the storage battery 125 when receiving the first instruction is within a range from the V2G lower limit SOC to the frequency control SOC, the ECU 131 controls the bidirectional charger 127 such that the storage battery 125 perform the charge and discharge for the frequency regulation with respect to the electric power network 12 according to the first instruction, as seen from fluctuation of the SOC after time t117a, t117b, and t117c shown in FIG. 5. In step S119, the ECU 131 controls the bidirectional charger 127 to charge the storage battery 125 with the electric power obtained from the electric power network 12 until the SOC of the storage battery 125 reaches the frequency control SOC.

In step S121, the ECU 131 determines whether the SOC of the storage battery 125 is more than or equal to the V2G lower limit SOC, if the V2G lower limit SOC≤the SOC, the procedure proceeds to step S123, and if the V2G lower limit SOC>the SOC, the procedure proceeds to step S119. In step S123, since the SOC of the storage battery 125 when receiving the second instruction is within a range from the V2G lower limit SOC to the full charge SOC, the ECU 131 controls the bidirectional charger 127 such that the storage battery 125 performs the continuous discharge with respect to the electric power network 12 to provide the spinning reserve according to the second instruction, as seen from decrease in the SOC after time t123 shown in FIG. 5.

In this manner, in the present embodiment, if the SOC of the storage battery 125 when receiving the first instruction from the aggregator 17 is within the range (hereinafter, referred to as a "first range") from the frequency control SOC to the V2G lower limit SOC, the ECU 131 starts control for the storage battery 125 to perform the charge and discharge for the frequency regulation with respect to the electric power network 12 according to the first instruction. Further, in the first range, as shown by hatched areas in FIG. 5, a hysteresis is respectively provided at an upper limit and a lower limit, so that the ECU 131 does not determine that the SOC is out of the first range due to vertical fluctuation of the SOC caused by the charge and discharge of the storage battery 125 for the frequency regulation.

If the SOC of the storage battery 125 when receiving the second instruction from the aggregator 17 is within the range (hereinafter, referred to as a "second range") from the full charge SOC to the V2G lower limit SOC, the ECU 131 starts control for the storage battery 125 to perform the continuous discharge with respect to the electric power network 12 to provide the spinning reserve according to the second instruction. As shown in FIG. 5, since the frequency control SOC is set to a value lower than the full charge SOC, and a lower limit value of each range is the V2G lower limit SOC, the first range is narrower than the second range.

The value of the frequency control SOC with respect to the full charge SOC is low to an degree that the full charge SOC is not exceeded (condition one) even if the charge and discharge for the frequency regulation corresponding to the first instruction is performed when the SOC of the storage battery 125 is the frequency control SOC, and a deterioration influence degree of the storage battery 125 is equal to or less than a threshold value (condition two) even when the charge and discharge is performed. Further, the deterioration influence degree of the storage battery 125 which performs the switching between short-term charge and discharge is larger as the SOC of the storage battery 125 is higher. In addition, a maximum value of the SOC at which a performance required when the storage battery 125 is charged can be realized, for example, a maximum value of the SOC at which the storage battery 125 can be continuously charged with a predetermined electric power amount, is lower as the temperature of the storage battery 125 is lower. Therefore, as the temperature of the storage battery 125 detected by the temperature sensor 129 is lower, the frequency control SOC is set lower. In this manner, the ECU 131 sets the frequency control SOC according to the temperature of the storage battery 125, satisfying the above-described two conditions.

As described above, according to the present embodiment, the charge and discharge of the storage battery 125 for the frequency regulation corresponding to the first instruction is performed with the SOC of the storage battery 125 within the first range from the frequency control SOC to the V2G lower limit SOC, the continuous discharge of the storage battery 125 for providing the spinning reserve to the electric power network 12 corresponding to the second instruction is performed with the SOC of the storage battery 125 within the second range from the full charge SOC to the V2G lower limit SOC. The first range is narrower than the second range, and the upper limit (frequency control SOC) of the first range is lower than the upper limit (full charge SOC) of the second range. In this manner, since the charge and discharge that correspond to the first instruction and the continuous discharge that corresponds to the second instruction which have different modes are respectively performed within a suitable SOC range, it is possible to efficiently obtain an incentive while suppressing deterioration of the storage battery 125 and to contribute to the electric power quality of the electric power system including the electric power network 12. Further, the incentive is benefit for an owner of the electric vehicle 15 when the electric vehicle 15 buys and sells the electric power by the above-described charge and discharge, and a main benefit thereof is money.

The frequency control SOC, which is the upper limit of the first range in which the charge and discharge that correspond to the first instruction and having a large influence on the deterioration of the storage battery 125 is performed, is set to a value such that the deterioration influence degree is equal to or less than the threshold value. Therefore, even if the charge and discharge that correspond to the first instruction is performed, deterioration of the storage battery 125 can be suppressed.

The performance required when the storage battery 125 is charged varies depending on the temperature of the storage battery 125. In other words, the lower the temperature of the storage battery 125, the lower is the maximum value in the range of the SOC at which the performance required when the storage battery 125 is charged can guaranteed. In the present embodiment, the frequency control SOC, which is the upper limit of the first range in which the charge and discharge that correspond to the first instruction is performed, is set to a smaller value as the temperature of the storage battery 125 is lower. Therefore, the range of the SOC in which the charge and discharge that correspond to the first instruction is performed can be set to a suitable range according to a temperature environment of the storage battery 125.

The V2G lower limit SOC which is a lower limit value in the range of the SOC in which the charge and discharge that correspond to the first instruction is performed and a lower limit value in the range of the SOC in which the continuous discharge that corresponds to the second instruction is performed is set based on the electric power amount required for the next traveling of the electric vehicle 15. Therefore, if the SOC of the storage battery 125 lowers to the V2G lower limit SOC, the ECU 131 does not allow the charge and discharge that correspond to the first instruction or the continuous discharge that corresponds to the second instruction. Therefore, it is possible to contribute to the power quality of the electric power system while securing the electric power amount required for the next traveling of the electric vehicle 15.

In a case where the storage battery 125 is charged when there is spare time before the next traveling of the electric vehicle 15, since the storage battery 125 is charged until the SOC of the storage battery 125 reaches the frequency control SOC which is the upper limit of the range in which the charge and discharge that correspond to the first instruction and the continuous discharge that corresponds to the second instruction are allowed, an opportunity to contribute to the electric power quality of the electric power system is increased, and the incentive can be efficiently obtained.

Incidentally, the present invention is not limited to the above-described embodiment and may be appropriately modified, improved, or the like. For example, in the above-described embodiment, the first instruction and the second instruction to be transmitted to the electric vehicle 15 are performed by the aggregator 17, but the operation may be performed by the power station 11 shown in FIG. 1, an electric power distribution company, or a server device managed by the government or a government agency. The server device is connected to the communication network 16 and can also communicate with the aggregator 17.

In the above-described embodiment, the storage battery 125 which participates in V2G and bidirectionally transfers the electric power to and from the electric power system is provided in the electric vehicle 15, but a stationary power storage facility (refer to FIG. 1) in which a large number of storage batteries similar to the storage battery 125 are installed may participate in V2G. In this case, the stationary power storage facility is connected to the electric power network 12 and can communicate with the aggregator 17 via the communication network 16. The stationary power storage facility has substantially the same configuration as the electric vehicle 15 shown in FIG. 2, and the frequency control SOC and the V2G lower limit SOC shown in FIG. 5 are also set. The frequency control SOC set in the stationary power storage facility is a value set by a manufacturer of the stationary power storage facility, and the V2G lower limit SOC set in the stationary power storage facility is also a value set by the manufacturer of the stationary power storage facility.

In the above-described embodiment, the V2G system has been described as an example. Since the V2G system is one of business models for realizing a smart grid, the electric power is bidirectionally transferred between the storage battery 125 mounted on the electric vehicle 15 and the electric power system, but the storage battery which bidirectionally transfers the electric power to and from the electric power systems is not limited to one mounted on the electric vehicle, like the stationary power storage facility described above. However, a system which transfers the electric power between the storage battery which is not mounted on the electric vehicle and the electric power system is included in a smart grid system rather than the V2G system in a narrow sense. Therefore, the above-described embodiment has been described using the V2G system as an example, but the present invention is also applicable to the smart grid system.

REFERENCE SIGNS LIST 11 power station
12 electric power network
13 electric power consumer
14 EVSE
15 electric vehicle
16 communication network
17 aggregator 18 home gateway
21 cable
22 connector
23 digital communication unit
121 inlet
123 digital communication unit
125 storage battery
127 bidirectional charger
129 temperature sensor
131 ECU

The invention claimed is:

1. A power storage device comprising:
a storage battery capable of transferring electric power to and from an external electric power network;
a receiver configured to receive an instruction related to transfer of the electric power to and from the electric power network; and
a controller configured to control charge and discharge of the storage battery according to the instruction,
wherein the instruction includes a first instruction for requesting switching between short-term charge and discharge from the storage battery to the electric power network, and a second instruction for requesting continuous discharge from the storage battery to the electric power network, and
wherein the controller is configured to allow the storage battery to start charge and discharge that correspond to the first instruction when a variable representing a state of charge of the storage battery by a level of a value is a value between a first value smaller than an upper limit value that the state of charge reaches when the storage battery is fully charged and a second value smaller than the first value, and to allow the storage battery to start discharge that corresponds to the second instruction when the variable is a value between the upper limit value and the second value.

2. The power storage device according to claim 1, wherein the storage battery is mounted on a transport equipment.

3. The power storage device according to claim 1, wherein when the receiver receives the first instruction and the second instruction, the controller gives priority to the second instruction when the variable is a value between the first value and the second value.

4. The power storage device according to claim 1, wherein the controller is configured to store, for each state of charge of the storage battery, a deterioration influence degree of the storage battery in a case where the storage battery performs the charge and discharge that correspond to the first instruction, and to set the first value to a value such that the deterioration influence degree in the case where the storage battery performs the charge and discharge that correspond to the first instruction is equal to or less than a threshold value.

5. The power storage device according to claim 1, wherein the controller sets the first value based on a temperature of the storage battery.

6. The power storage device according to claim 5, wherein the controller sets the first value to a smaller value as the temperature of the storage battery is lower.

7. The power storage device according to claim 2, wherein the controller sets the second value based on an electric power amount required for a next traveling of the transport equipment.

8. The power storage device according to claim 2, wherein in a case where a time difference from the current time to a next scheduled traveling date and time of the transport equipment is larger than or equal to predetermined time, the controller allows the storage battery to charge until the variable reaches the first value if the receiver does not receive the instruction.

9. A power storage device comprising:
a storage battery capable of transferring electric power to and from an external electric power network;
a receiver configured to receive an instruction related to transfer of the electric power to and from the electric power network; and
a controller configured to control charge and discharge of the storage battery according to the instruction,
wherein the instruction includes a first instruction for requesting switching between short-term charge and discharge from the storage battery to the electric power network, and a second instruction for requesting continuous discharge from the storage battery to the electric power network,
wherein the controller is configured to allow the storage battery to charge and discharge that correspond to the first instruction when a variable representing a state of charge of the storage battery by a level of a value is within a first range, and to allow the storage battery to discharge that corresponds to the second instruction when the variable is within a second range, and
wherein the first range is narrower than the second range, and an upper limit of the first range is lower than an upper limit of the second range.

10. A transport equipment including the power storage device according to claim 1.

11. A control method for a power storage device including a storage battery capable of transferring electric power to and from an external electric power network, a receiver configured to receive an instruction related to transfer of the electric power to and from the electric power network, and a controller configured to control charge and discharge of the storage battery according to the instruction, wherein
the instruction includes a first instruction for requesting switching between short-term charge and discharge from the storage battery to the electric power network, and a second instruction for requesting continuous discharge from the storage battery to the electric power network, and
the control method comprises:
allowing the storage battery to start charge and discharge that correspond to the first instruction, when a variable representing a state of charge of the storage battery by a level of a value is a value between a first value smaller than an upper limit value that the state of charge reaches when the storage battery is fully charged and a second value smaller than the first value; and
allowing the storage battery to start discharge that corresponds to the second instruction, when the variable is a value between the upper limit value and the second value.

* * * * *